US008917522B2

(12) United States Patent
Nakamura et al.

(10) Patent No.: US 8,917,522 B2
(45) Date of Patent: Dec. 23, 2014

(54) SEMICONDUCTOR DEVICE

(75) Inventors: Takahiro Nakamura, Tochigi (JP);
Haruei Kokuho, Tochigi (JP); Takahiro Yamada, Tochigi (JP); Koichi Kimura, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 175 days.

(21) Appl. No.: 13/576,225

(22) PCT Filed: Jan. 20, 2011

(86) PCT No.: PCT/JP2011/000275
§ 371 (c)(1),
(2), (4) Date: Jul. 31, 2012

(87) PCT Pub. No.: WO2011/096164
PCT Pub. Date: Aug. 11, 2011

(65) Prior Publication Data
US 2012/0300418 A1 Nov. 29, 2012

(30) Foreign Application Priority Data

Feb. 3, 2010 (JP) ................................. 2010-022116

(51) Int. Cl.
*H01L 25/16* (2006.01)
*H01L 23/528* (2006.01)
*H05K 1/02* (2006.01)
*H01L 25/18* (2006.01)

(52) U.S. Cl.
CPC .......... *H01L 25/162* (2013.01); *H01L 23/5286* (2013.01); *H05K 1/0262* (2013.01); *H01L 25/18* (2013.01); *H05K 1/0216* (2013.01); *H05K 1/0227* (2013.01); *H05K 2201/10166* (2013.01); *H01L 2924/0002* (2013.01)
USPC ......................................... 361/775; 257/693

(58) Field of Classification Search
USPC ........................................... 361/775; 257/693
See application file for complete search history.

(56) References Cited

U.S. PATENT DOCUMENTS

| 5,338,970 A | 8/1994 | Boyle et al. |
| 6,008,593 A * | 12/1999 | Ribarich ....................... 315/307 |
| 7,576,629 B2 * | 8/2009 | Nagamatsu et al. .......... 333/247 |
| 2006/0146135 A1 | 7/2006 | Nagamatsu et al. |

FOREIGN PATENT DOCUMENTS

| JP | 07-169880 A | 7/1995 |
| JP | 08-293578 A | 11/1996 |
| JP | 2002-184939 A | 6/2002 |
| JP | 2003-178895 A | 6/2003 |
| JP | 2005-032912 A | 2/2005 |
| JP | 4073621 B2 | 2/2008 |

OTHER PUBLICATIONS

Chinese Office Action dated Jul. 22, 2014, issued in corresponding Chinese Application No. 201180007989.3 w/English Translation; (23 pages).

* cited by examiner

*Primary Examiner* — Andargie M Aychillhum
(74) *Attorney, Agent, or Firm* — Westerman, Hattori, Daniels & Adrian, LLP

(57) ABSTRACT

A semiconductor device that can suppress variation of GND potential of a control board and prevent malfunction of IC without restricting a mounting direction of the IC of the control board is provided. In a power module 10 as a semiconductor device in which an insulating board 31 having a power switching element 24 and a control board 22 having IC 50 for controlling the power switching element 24 are vertically provided in a case body 19, GND pins 61 are provided at both the sides of the IC 50, a GND pattern 51 to which the GND pins 61 of the IC 50 are connected is provided in the control board 22, and a GND loop breaking slit 70 as a breaking portion for breaking a GND loop formed by electrical connection of the IC 50, the GND pins 61 at both the sides of the IC 50 and the GND pattern 51 is provided to the GND pattern 51.

7 Claims, 12 Drawing Sheets

FIG.7
(A)
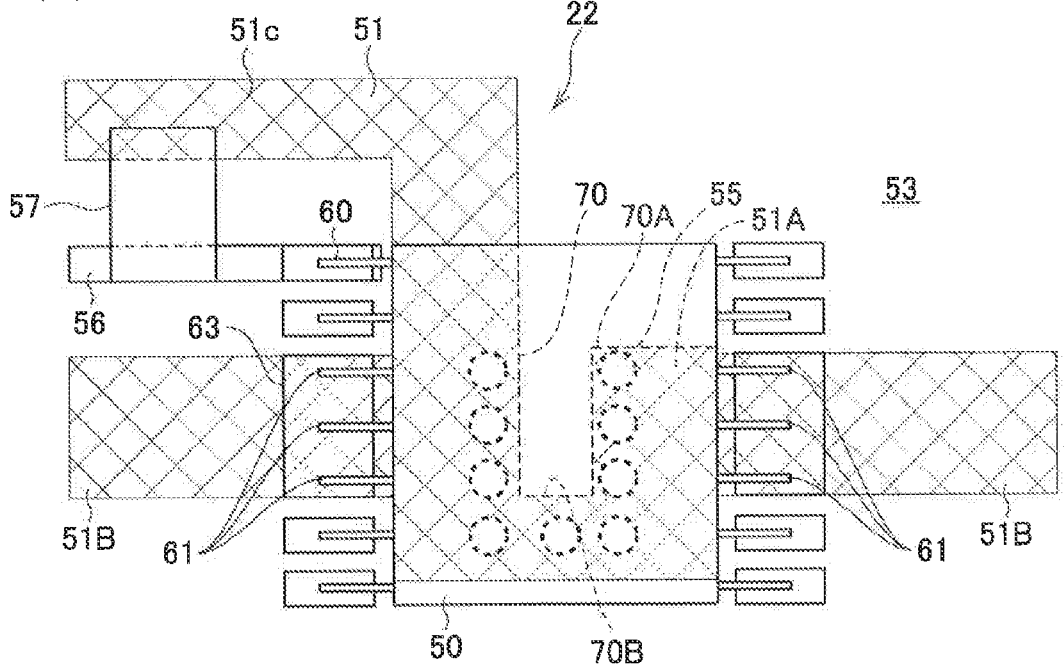
(B)
<GND PATTERN EQUIVALENT CIRCUIT>
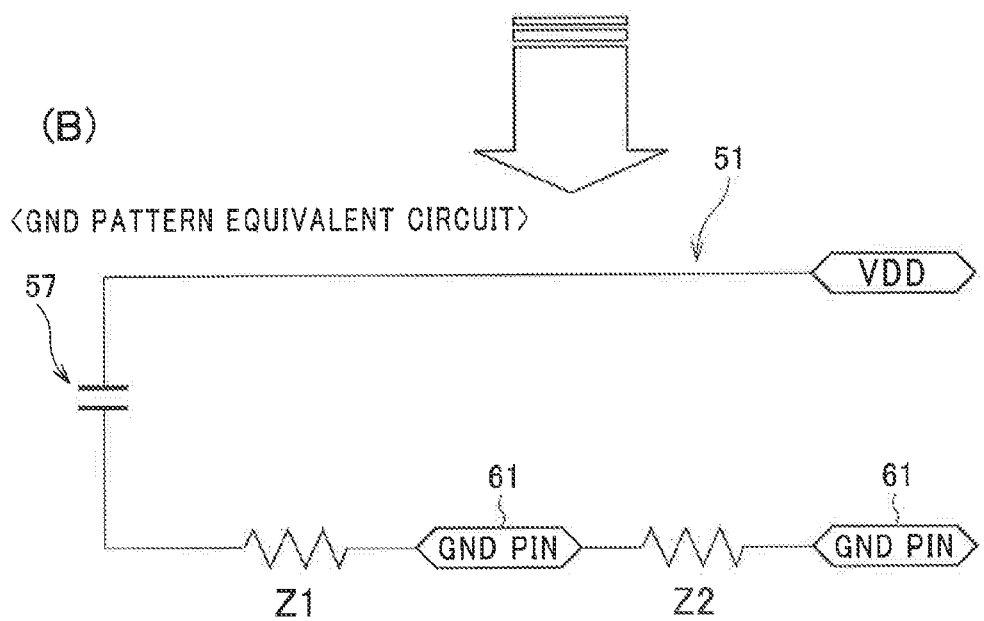

FIG.8
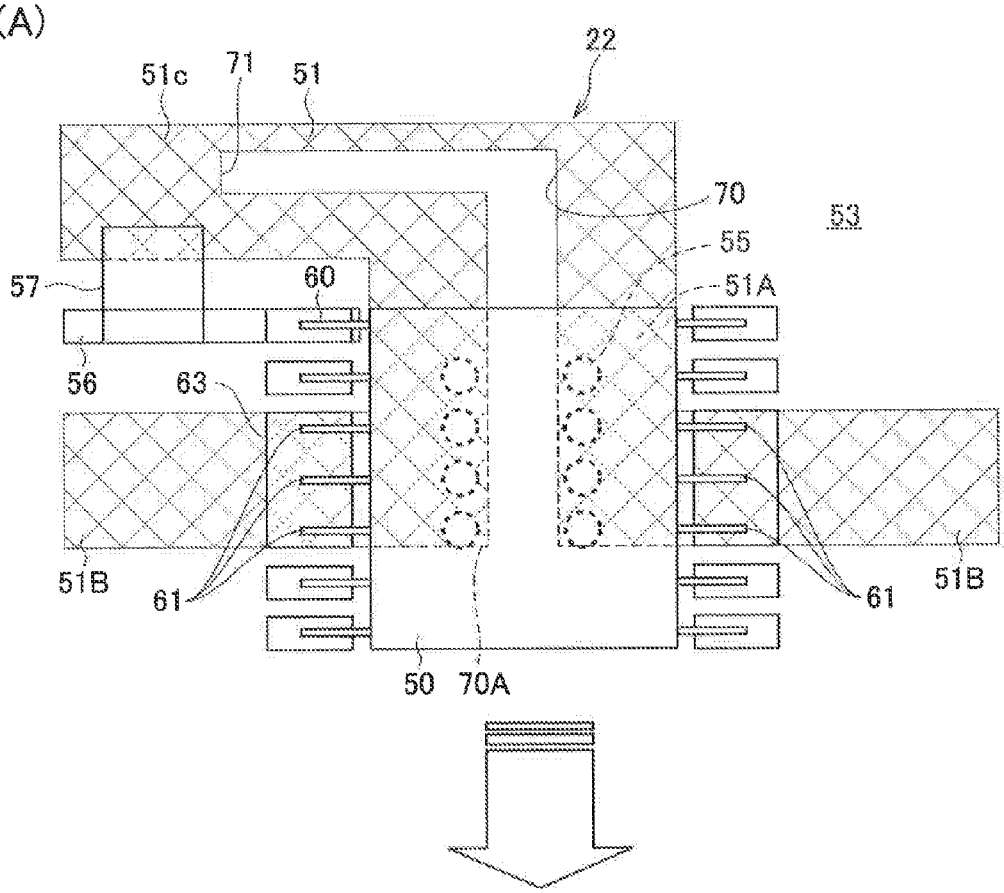
(A)
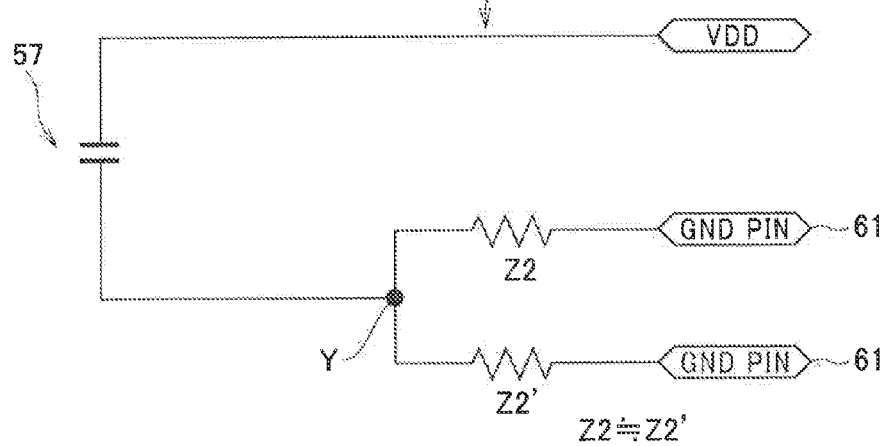
(B)
<GND PATTERN EQUIVALENT CIRCUIT>

A-A'

US 8,917,522 B2

SEMICONDUCTOR DEVICE

CROSS-REFERENCED TO RELATED APPLICATION

This application is a National Stage entry of International Application PCT/JP2011/000275, filed Jan. 20, 2011, which claims priority to Japanese Patent Application No. 2010-022116, filed Feb. 03, 2010, the disclosure of the prior applications are hereby incorporated in their entirety by reference.

TECHNICAL FIELD

The present invention relates to a semiconductor device having a power switching element, and particularly to a technique of preventing realfunction caused by magnetic field occurring at a switching time.

BACKGROUND ART

A semiconductor device having a modularized structure of a power switching element such as MOSFET, IGBT or the like and IC for driving the power switching element (also called as power module) has been hitherto known as a semi conduct or device used for power conversion of an inverter or the like. In this type of semiconductor device, an insulating board having a power switching element mounted therein and a control board having IC which is mounted therein and controls the power switching element are arranged and modular ly configured in the same housing.

Recently, advancement in performance of power switching elements has promoted increase of current flowing through the power switching elements and increase of the switching speed thereof. However, magnetic field having a large magnetic field intensity occurs when a power switching element is switched, and there has been a problem that this magnetic field causes malfunction of IC on the control board and various kinds of circuits.

Specifically, a GND (GND; Ground) pattern is provided on the control hoard to reserve ground potential (hereinafter referred, to as GND potential), and GND pins are arranged at both the sides of IC so as to confront one another so that each GND pin is connected to the GND pattern when IC is mounted. The GND pins at both the sides of IC are electrically connected to one another in internal circuits of IC. Therefore, when the IC is provided on the GND pattern, a GND loop through which the internal circuits of IC, the GND pins at both the sides of the IC and the GND pattern are connected to one another is formed. When this GND loop crosses magnetic field occurring at the switching time of the power switching element, induction current is induced in the GND loop and therefore the GND potential varies, so that malfunction of IC and the various kinds of circuits may occur.

Therefore, there has been proposed a technique of arranging a plane containing a GND loop in a control board substantially vertically to the direction of main current flowing in an insulating board in which a power switching element is mounted, thereby preventing magnetic field caused by the main current from generating induction current in the GND loop (see Patent Document 1, for example).

PRIOR ART DOCUMENT

Patent Document

Patent Document 1: Japanese Patent Number 4,073,621

SUMMARY OF THE INVENTION

Problem to be Solved by the Invention

However, the prior art has a problem that the mounting direction of IC on the control board is rest rioted by the direction of the main current flowing through the insulating board, and the degree of freedom of board pattern layout in the control board is reduced.

The present invention has been implemented in view of the foregoing situation, and has an object to provide a semiconductor device that can suppress variation of GND potential of a control board without restricting the mounting direction, of IC on the control board and prevent malfunction of IC.

Means of Solving the Problem

In order to attain the above object, according to the present invention, a semiconductor device including an insulating board having a power switching element, and a control board having IC for controlling the power switching element that are mounted vertically in a housing, is characterized in that GND pins are provided at both the sides of the IC, and the control board is provided with a GND pattern to which the GND pins of the IC are connected, and a breaking portion for breaking a GND loop formed by electrical connection of the IC, the GND pins at both the sides of the IC and the GND pattern is provided.

According to the above invention, the breaking portion for breaking the GND loop is provided to the control board. Therefore, even when the control board is exposed to magnetic field caused by switching of the power switching element, no GND loop crossing the magnetic field exists in the control board irrespective of the mounting direction of the IC. Accordingly, no induction, current is induced, in the GND pattern, so that the variation of the GND potential can be suppressed and the malfunction of the IC can be prevented.

Furthermore, according to the present invention, in the semiconductor device, the breaking portion is constructed by a GND loop breaking slit that, is provided in an area of the GND pattern covered by the IC so that the GND loop breaking slit traverses an area between the GND pins at both the sides of the IC.

According to the above invention, the slit is provided to the GND pattern. Therefore, it is unnecessary to modify the patterns of IC and the various kinds of circuits mounted in the control board, so that the breaking portion can be simply configured.

According to the present invention, in the semiconductor device, a plurality of the GND pins are arranged at each of both the sides of the IC in a range of a predetermined length so that the GND pins at both the sides of the IC confront one another through the IC, and a slit length of the GND loop breaking slit is set to be equal to the predetermined length at which the GND pins are arranged.

According to the above invention, the GND loop can be broken with minimizing the defective portion of the GND pattern which is caused by the GND loop breaking slit, According to the present invention, in the semiconductor device, the control board comprises a multilayered board in which circuits of respective layers are connected to one another through a through-hole, and the through-hole is provided at an edge portion of the GND loop breaking slit.

According to the above invention, even when potential is induced at both the sides of the GND loop breaking slit by the magnetic ffeld at the switching time, the potential concerned, is led to the other layers through the through-hole, so that the stability of the GND potential can be enhanced.

Furthermore, according to the present invention, in the semiconductor device, the control, board is provided with a power supply pattern and a bypass capacitor through which the power supply pattern and the GND pattern are connected to each other, and the GND loop breaking slit is provided so that the GND pins at both the sides of the IC are arranged in a star-wired connection style with the bypass capacitor as a starting point.

According to the above invention, circuit impedances from the bypass capacitor to the respective GND pins at both the sides of the IC are substantially equal to one another, so that the potential difference among the GND pins is suppressed.

Still, furthermore, according to the present invention, in the semiconductor device, the GND pattern is formed so as to avoid a place to which the GND pins provided at one side of the IC are connected, thereby constructing the breaking portion.

According to the above invention, the area of the GND pattern which is located just below the IC is not trimmed, so that the contact area between the IC and the GND pattern is not reduced, and therefore a radiation effect can be expected.

Furthermore, according to the present invention, in the semiconductor device, an opening portion for electrically breaking the GND pins at both the sides of the IC is provided in the IC, thereby constructing the breaking portion.

According to the above invention, the area of the GND pattern which is located gust below the IC is not trimmed, so that a radiation effect can be expectable without reducing the contact area between the IC and the GND pattern. Furthermore, it is unnecessary to modify the GND pattern of the control board, and therefore even when a control board having any GND pattern is mounted, formation of a GND loop can be surely prevented.

Effect of the Invention

According to the present invention, the breaking portion for breaking the GND loop is provided to the control board. Therefore, even when the control board is exposed to magnetic field caused by switching of the power switching element, no GND loop crossing the magnetic field exists in the control, board, irrespective of the mounting direction of the IC. Accordingly, no induction current is induced in the GND pattern, so that the variation of the GND potential can be suppressed and the malfunction of the IC can be prevented.

Here, the breaking portion is constructed by a GND loop breaking slit that is provided in an area of the GND pattern covered by the IC so that the GND loop breaking slit traverses an area between, the GND pins at both the sides of the IC. Therefore, it is unnecessary to modify the patterns of IC and the various kinds of circuits mounted in the control board, so that the breaking portion can be simply configured.

Furthermore, a plurality of the GND pins are arranged at each of both the sides of the IC in a range of a predetermined length so that the GND pins at both the sides of the IC confront one another through the IC, and a slit length of the GND loop breaking slit is set to be equal to the predetermined length at which the GND pins aire arranged, whereby the GND loop can be broken with minimizing the defective portion of the GND pattern which is caused by the GND loop breaking slit.

Furthermore, the control board comprises a multilayered board in which circuits of respective layers are connected to one another through a through-hole, and the through-hole is provided at an edge portion of the GND loop breaking slit, whereby even when potential is induced at both the sides of the GND loop breaking sift by the magnetic field at the switching time, the potential, concerned is led to the other layers through the through-hole, so that the stability of the GND potential can be enhanced.

Still furthermore, the control board is provided with a power supply pattern and a bypass capacitor through which the power supply pattern and the GND pattern are connected to each other, and the GND loop breaking slit is provided so that the GND pins at both the sides of the IC are star-wired with the bypass capacitor as a starting point, whereby circuit impedances from the bypass capacitor to the respective GND pins at both the sides of the IC are substantially equal to one another, so that the potential difference among the GND pins is suppressed.

Still furthermore, the GND pattern is formed so as to avoid a place to which the GND pins provided at one side of the IC are connected, thereby constructing the breaking portion. Accordingly, the area of the GND pattern which is located just below the IC is not trimmed, so that a radiation effect is expectable without reducing the contact area between the IC and the GND pattern.

Still furthermore, an opening portion for electrically breaking the GND pins at both the sides of the IC is provided in the IC to construct the breaking portion, whereby the area of the GND pattern which is located just below the IC is not trimmed, and therefore a radiation effect can be expected without reducing the contact area between the IC and the GND pattern. Furthermore, it is unnecessary to modify the GND pattern of the control board, and therefore even when a control board having any GND pattern is mounted, formation of a GND loop can be surely prevented.

BRIEF DESCRIPTION OF THE DRAWINGS

FIG. 7 is a diagram showing another example of a GND loop breaking slit.

FIG. 8 is a diagram, showing another example of the GND loop breaking slit.

MODE FOR CARRYING OUT THE INVENTION

Figure 1:
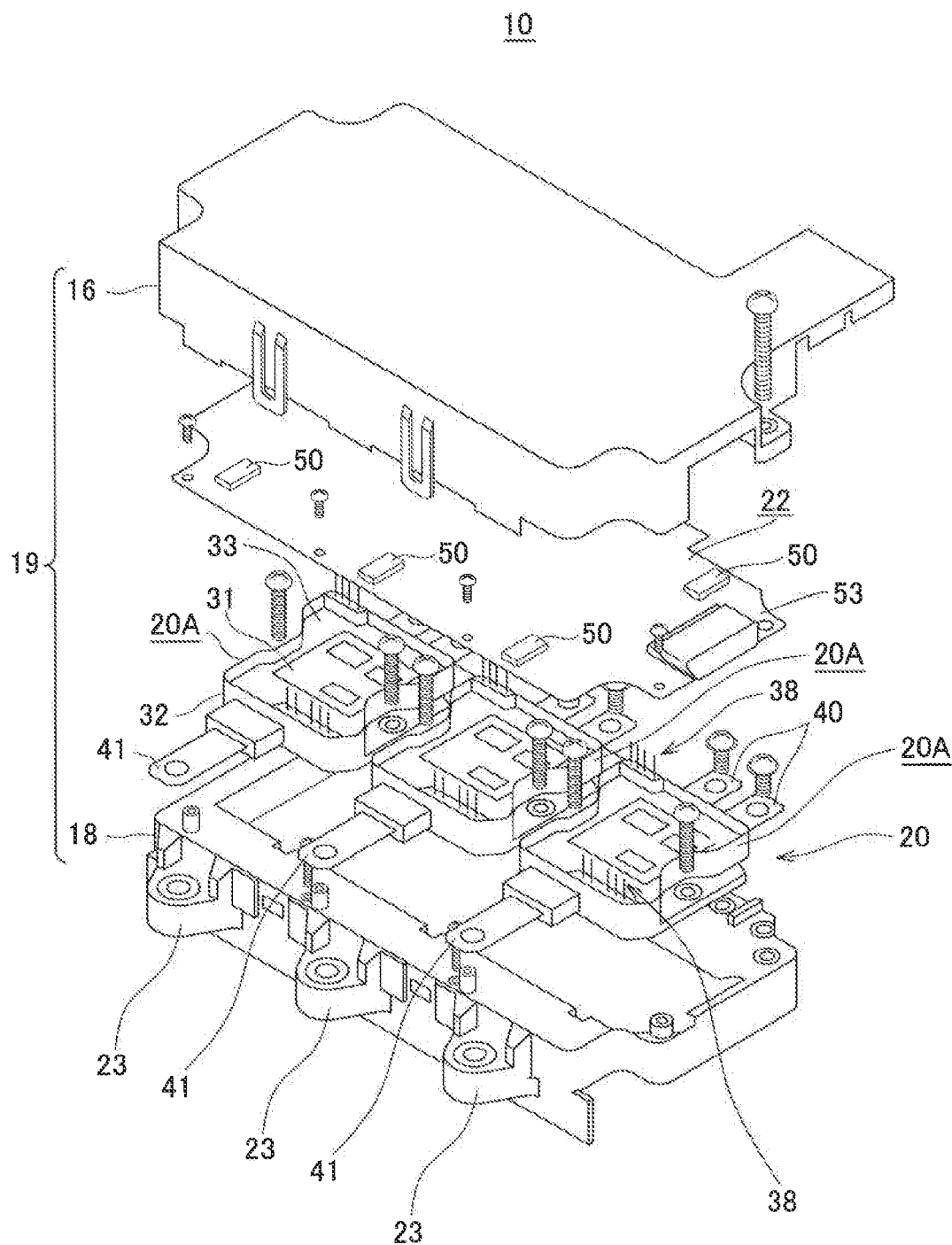
FIG. 1 is an exploded perspective view showing a power module as a semiconductor device according to a first embodiment of the present invention.

Embodiments according to the present invention will be described hereunder with reference to the drawings.
<First Embodiment>
FIG. 1 is an exploded perspective view showing a power module 10 according to an embodiment.

The power module 10 is a semiconductor device used for a power conversion device for converting DC current of a DC power source mounted in a vehicle such as a train, a car or the like to AC current and supplying the AC current to an electrical motor as a power source mounted in the vehicle to drive the electrical motor, etc. The power module 10 for driving a three-phase induction motor as an electrical motor is shown in FIG. 1.

As shown in FIG. 1, the power module 10 has a box-shaped case body 19 constructed by an upper cover 16 and a lower cover 18, and a semiconductor module 20 containing an insulating board 31 constituting a three-phase inverter circuit 30 (FIG. 2) and a control board 22 on which an electrical circuit for driving the three-phase inverter circuit is mounted, are accommodated and modularized in the case body 19. Output terminals 23 ot three phases are provided on an outer surface of the lower cover 18 to be arranged side by side. A three-phase induction motor is connected to these output terminals 23, DC input terminals 40 described later are drawn out from the opposite outer surface of the lower cover 18, and a DC power source for a vehicle is connected through a smoothing capacitor to the DC input terminals 40.

Figure 2:
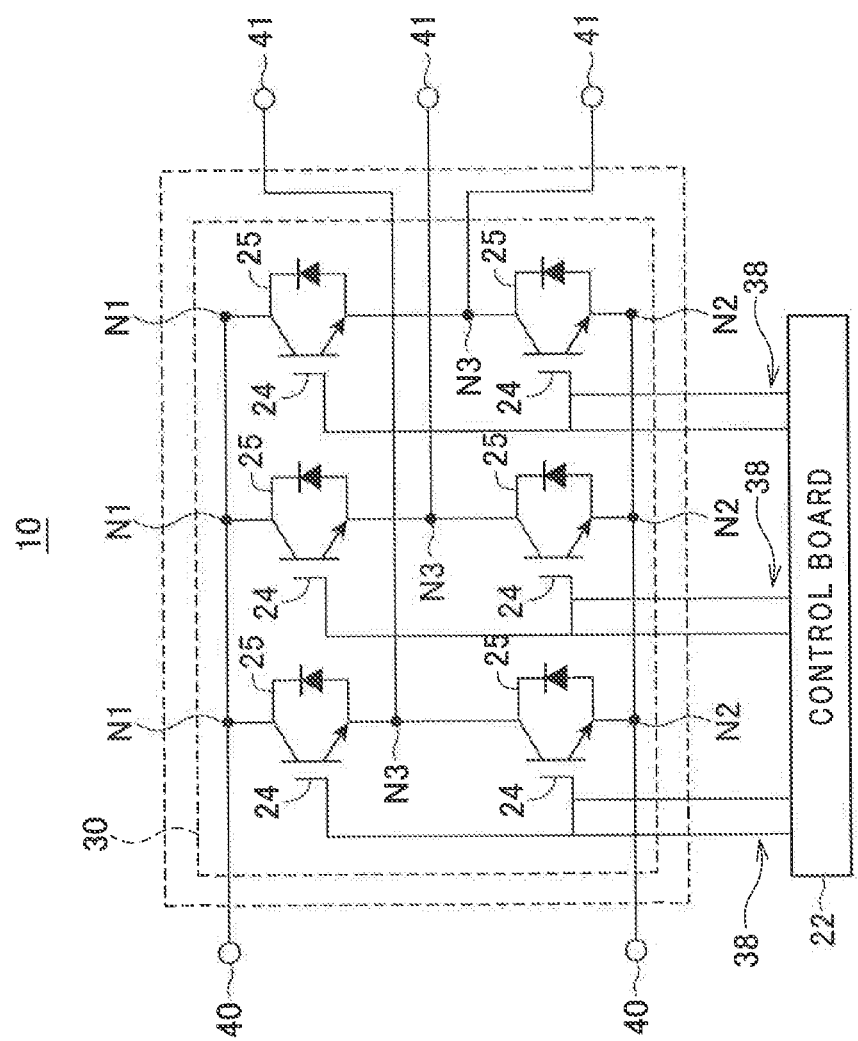
FIG. 2 is a circuit diagram of a three-phase inverter circuit.

FIG. 2 is a circuit diagram showing the three-phase inverter circuit 30 contained in the semiconductor module 20.

As shown in FIG. 2, the three-phase inverter circuit 30 is configured, to have power switching elements 24 connected to each other in series and flywheel diodes 25 which are connected to these power switching elements 24 in inverse-parallel. A node N1 at one end side of the two series-connected power switching elements 24 is connected to a DC input terminal 40 at the positive side of an input power source, and a node N2 at the other end is connected to a DC input terminal 40 at the negative side, whereby a connection point N3 of the two power switching elements 24 is configured as an AC output terminal 41 for one phase of AC output. The AC output terminal 41 constitutes a terminal portion for AC output together with the output terminal 23 of the lower cover 18.

In order to obtain an AC output of three phases required to drive a three-phase induction motor, the three-phase inverter circuit 30 is provided with three pairs of series-connected two power switching elements 24 which are arranged, in parallel, and AC output terminals 41 of three phases are constructed by the connection points N3 of the respective pairs, A power element such as IGBT, MOSFET or the like may be used as the power switching element 24.

As shown in FIG. 1, the three-phase inverter circuit 30 is divided and packaged into three packages 20A every one-phase AC output, and these packages 20A are arranged side by side to construct the semiconductor module 20, Each package 20A is constructed by accommodating, in a case body 32, an insulating board 31 for one phase of AC output on which the two power switching elements 24 and the flywheel diode 25 are mounted, and sealing the insulating board 31 with resin material 33, One side surface of each package 20A is provided with a pair of DC input terminals 40 corresponding to the nodes N1, N2, and the confronting side surface at the opposite side is provided with the AC output terminal 41 corresponding to the connection point N3. The respective packages 20A are arranged side by side with, the DC input terminals 40 facing the same side.

In the control board 22 are mounted a driving circuit for making each power switching element 24 of the three-phase inverter circuit 30 perform a switching operation, and IC 50 (FIG. 1) for driving the driving circuit on the basis of a control signal output from a motor ECU (electronic control unit) mounted at a vehicle side.

As shown in FIG. 1, the control board 22 is fixed to the lower cover 18 with screws so as to cover substantially the whole of each of the packages 20A arranged side by side, and electrically connected through pin-like connection portions 38 provided to these packages 20A.

Figure 3:
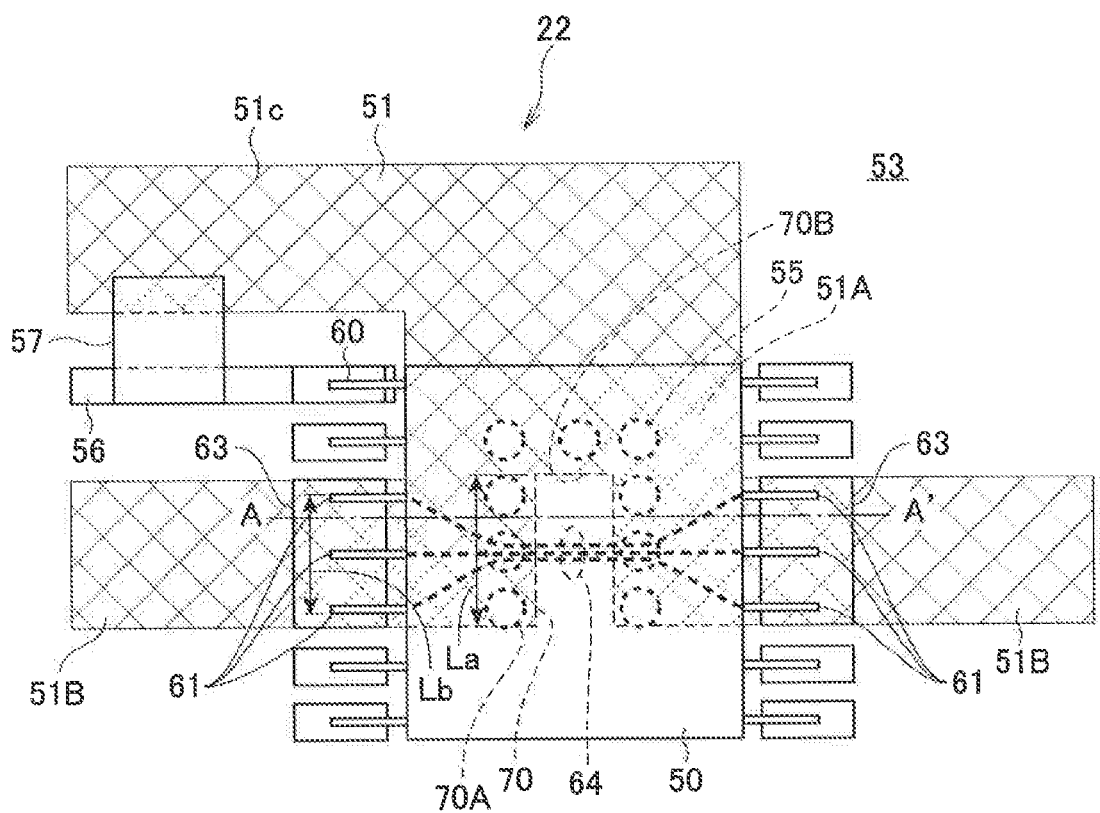
FIG. 3 is a diagram showing a mount state of a control board.
Figure 4:
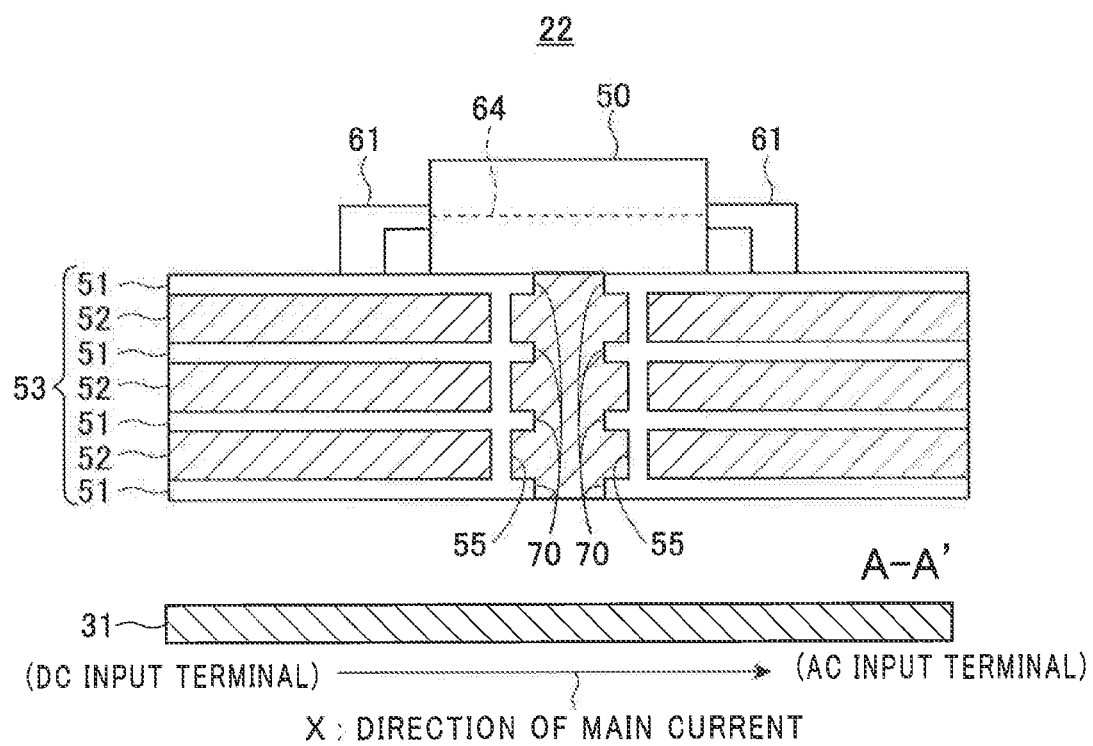
FIG. 4 is a cross-sectional view taken along an A-A' line of FIG. 3.

FIG. 3 is a diagram showing the mount state of the control board 22, and FIG. 4 is a cross-sectional view taken along an A-A' line of FIG. 3.

As shown in FIG. 4, the control board 22 comprises a multilayered board 53 as a penetration muitilayered plate which is formed by laminating plural, insulating layers 52 each having a GND pattern, and various kinds of circuits formed, on the front and back surfaces thereof and in which the circuits of the respective layers are connected to one another through through-holes 55 as shown in FIG. 3, Control circuit wire patterns of a driving circuit, etc. as the various kinds of circuits are formed on the multilayered board 53, and the GND pattern 51, IC 50, a power supply pattern 56, a bypass capacitor 57 for connecting the power supply pattern 56 and the GND pattern 51, etc. are provided on the front surface layer. The bypass capacitor 57 is provided to stabilize the operations of the circuits by suppressing variation of a DC power supply voltage.

The IC 50 is a chip packaged, in a plate-shaped casing which is rectangular in top view, and it is provided with many connection pins at both the sides thereof. These connection pins contain a power supply pin 60 connected to the power supply pattern 56 and GND pins 61 connected to the GND pattern 51. Plural GND pins 61 are provided at both the sides of the IC 50 so as to confront one another between the sides, and connected to the GND pattern 51 through radiation fins 63. The GND pins 61 at both the sides of the IC 50 are conducted to one another through the internal circuits of the IC 50, and a GND line 64 is formed in the IC 50 across the IC 50 so as to connect the GND pins 61 at one side and the GND pins 61 at the other side.

The GND pattern 51 provided in the control board 22 is provided in an area covered by the IC 50 when the IC 50 is mounted, In this embodiment, the GND pattern 51 is configured to contain a main area S1A provided in the area covered by the IC 50, connection, pin areas 51B extending from the main area 51A to both the sides of the IC 50 at which the GND pins 61 are provided, and a bypass capacitor connection area 51C for connecting the main area 51A to the bypass capacitor 57.

As described above, the control board 22 is disposed so as to cover each, package 20A of the semiconductor module 20, and the insulating board 31 mounted in each package 20A and the control, board 22 are arranged to be vertically stacked as shown in FIG. 4. As described above, the insulating board 31 is provided with the power switching elements 24, and each of the DC input terminals 40 and each of the AC output terminals 41 are arranged to confront each other with sandwiching the power switching elements 24 therebetween. Accordingly, large main current flows in a direction X from, the DC input terminals 40 to the AC output terminals 41 (in the opposite direction under AC/DC conversion.) when the power switching elements 24 perform the switching operation.

When main current flows in the insulating board 31, magnetic field is generated by the main current. Since the control board 22 is disposed on the insulating board 31, the control board 22 is exposed to the magnetic field. At this time, in a case where a GND loop connecting the GND line 64 of the IC 50, the GND pins 61 and the GND pattern 51 is formed, in the control board 22, induction current is induced in the GND loop when the GND loop crosses the magnetic field. Therefore, the GND potential varies and malfunction may occur in the IC 50 and the various kinds of circuits of the control board 22.

Therefore, according to this embodiment, as shown in FIG. 3, a GND loop breaking slit 70 is formed in the main area 51A covered by the IC 50 out of each GND pattern 51 of the control board 22 so that the main area 51A is cut out so as to break the connection between the GND pins 61 at both the sides of the IC 50, thereby preventing formation of the GND loop.

Figure 5:
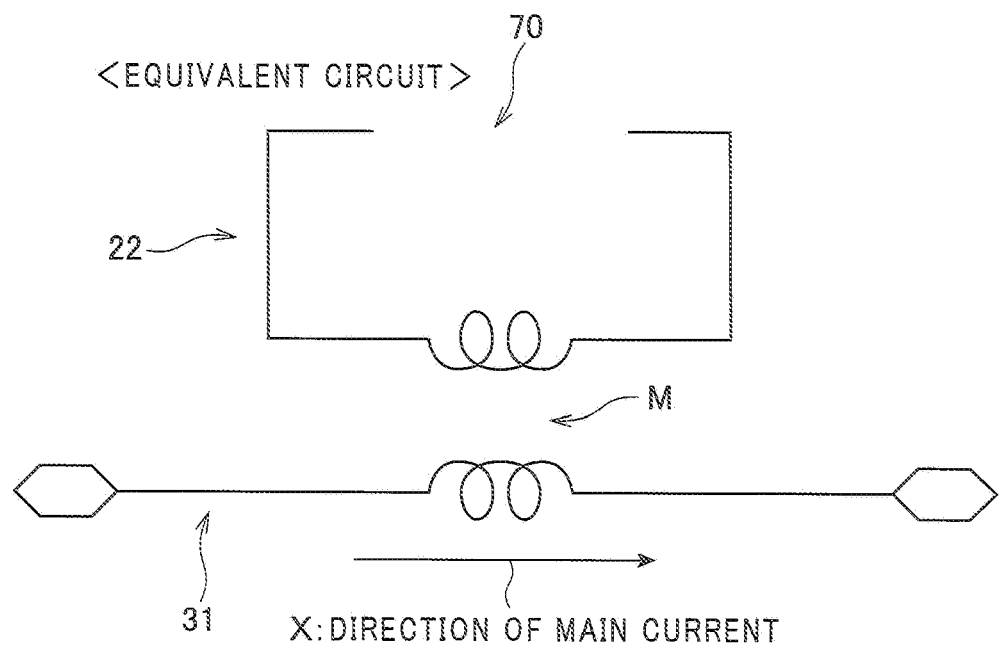
FIG. 5 is an equivalent circuit diagram showing the relationship between occurrence of magnetic field caused by main current of an insulating board and induction current induced, in the control board by the magnetic field.

FIG. 5 is an equivalent circuit diagram showing the relationship between occurrence of the magnetic field caused by the main current of the insulating board 31 and the induction current induced in the control board 22 by the magnetic field.

As shown in FIG. 5, mutual inductance M exists between the circuit of the insulating board 31 and the circuit containing the GND pattern 51 of the control board 22. In a case where magnetic field is generated by main current of the insulating board 31, when a GND loop which is constructed by the GND line 64 of the IC 50, the GND pins 61 and the GND pattern 51 and crosses the magnetic field exists in the control board 22, induction current is induced, in the GND loop concerned by the mutual inductance M. However, according to this embodiment, each GND loop breaking slit 10 serves as a breaking portion for breaking the GND loop, and thus no GND loop exists, so that no induction current is induced in the GND pattern 51.

Accordingly, even when strong magnetic field occurs in the insulating board 31 at the switching time, variation of the GND potential is suppressed, and the IC 50 and the various kinds of circuits of the control board 22 are prevented from malfunctioning. Furthermore, occurrence of induction current can be suppressed irrespective of the mounting direction of the IC 50 (more accurately, the direction of the GND line 64) to the direction X of the main current of the insulating board 31, and therefore the degree of freedom of the board pattern layout in the control board 22 is not reduced.

The GND loop breaking slits 70 may be designed to have such dimension and shape that they traverse the area between the GND pins 61 at both the sides of the IC 50. That is, as shown in FIG. 3, the GND loop breaking slit 70 is formed to have such a length (slit length) La that all the GND pins 61 at both the sides are contained between a cut-out opening end 70A as one end portion in the longitudinal direction and a bottom portion 70E as the other end portion. The length La is set to be equal to a predetermined arrangement length Lb corresponding to a range where the GND pins 61 at one side are arranged, whereby the GND loop can be broken with minimizing the defective portions of the GND pattern 51 which are caused, by the GND loop breaking slits 70.

Here, in the control board 22 of this embodiment, the plural through-holes 55 are formed along the edge portions of the GND loop breaking slits 70 provided in the mam area 51.A of the GND pattern 51. Accordingly, even when potential is induced at both the sides of the GND loop breaking slits 70 by magnetic field under the switching operation, the potential is led through the through-holes 55 to the GND pattern 51 of the other layers, so that the GND potential can be stabilized. It is effective that the through-holes 55 are provided to confront one another through the GND loop breaking slits 70, that is, at places corresponding to breaking points of the GND loop.

Figure 6:
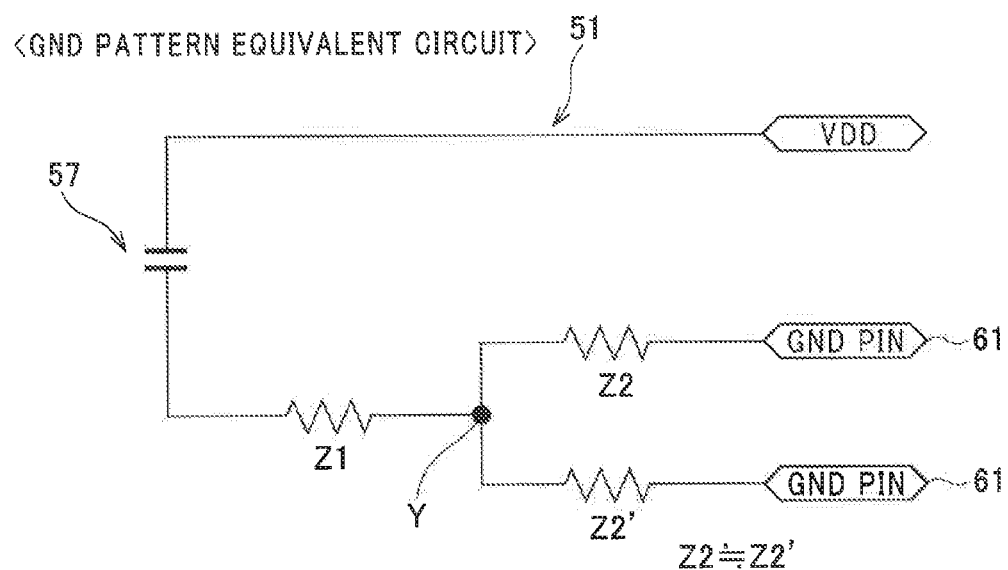
FIG. 6 is a diagram showing an equivalent circuit of a GND pattern.

FIG. 6 is a diagram showing an equivalent circuit, of the GND pattern 51.

As shown in FIG. 6, the GND pattern 51 is connected to VDD as a power source through the bypass capacitor 57, and the GND pins 61 at both the sides of the IC 50 are connected to the bypass capacitor 57. A circuit impedance Z1 of the bypass capacitor connection area 51C and circuit impedances Z1, Z2 to each GND pin 61 in the main area 51A are contained in the area from the bypass capacitor 57 to each of the GND pins 61 at both the sides of the IC 50, At this time, the cut-out opening end 70A of each GND loop breaking slit 70 is provided at the opposite side to the bypass capacitor 57 in the main area 51A when viewed from the GND pins 61 as shown in FIG. 3. Therefore, the GND pins at both the sides of the IC 50 are split up into two groups by the GND loop breaking slit 70 when viewed from the bypass capacitor 57, and the respective GND pins 61 at both the sides of the IC 50 are connected to one another in a star-wired connection style with the bypass capacitor 57 as a starting point as shown in FIG. 6. Accordingly, the circuit impedances Z2, Z2' from the split point Y (corresponding to the bottom portion 70B of FIG. 3) caused by the GND loop breaking slit 70 in the main area 51. A to each of the GND pins 61 at both the sides of the IC 50 are substantially equal to each other, and the potential difference between the GND pins 61 can be suppressed.

On the other hand, when, the cut-out opening end 70A of the GND loop breaking silt 70 is provided between the GND pin 61 and the bypass capacitor 57 as shown, in FIG. 7(A), the GND pins 61 at both the sides of the IC 50 are connected to each other in series as shown in FIG. 7 (B) when viewed from the bypass capacitor 57. In this arrangement, the circuit impedances from the bypass capacitor 57 to the respective GND pins 61 at both the sides of the IC 50 are different from each other. Accordingly, in this case, it is preferable to reduce the difference between the circuit impedances by using a material having a low impedance for the GND pattern 51.

As described above, according to this embodiment, the control board 22 is provided with the GND loop breaking slit 70 as the breaking portion for breaking the GND loop. According to this construction, even when, the control, board 22 is exposed to the magnetic field caused by the switching operation, of the power switching element 24, there does not exist any GND loop crossing the magnetic field in the control board 22 irrespective of the mounting direction of the IC 50. Accordingly, no induction current is induced on the GND pattern 51, and the variation of the GND potential is suppressed, so that the malfunction of IC can be prevented.

Particularly, according to this embodiment, the GND loop breaking slit 70 as the breaking portion is provided in the main area 51A of the GND pattern 51 covered by the IC 50 so as to traverse the area between the GND pins 61 provided at both the sides of the IC 50. According to this construction, it is unnecessary to modify the IC 50 mounted in the control board 22 and the patterns of the various kinds of circuits, and the breaking portion can be simply configured.

Furthermore, according to this embodiment, the slit length L of the GND loop breaking slits 70 is set to be equal to the arrangement length Lb at which the GND pins 61 are provided. Therefore, the GND loop can be broken with minimizing the defective portions of the GND pattern 51 which are caused by the GND loop breaking slits 70.

According to this embodiment, the control board 22 is constructed by the multilayered board 53 in which the circuits of the layers are connected to one another through the through-holes 55, and the through-holes 55 are provided at the edge portions of the GND loop breaking slits 70. According to this construction, even when potential is induced at both the sides of the GND loop breaking slit 70 by the magnetic field under the switching operation, the potential concerned is led to the other layers through the through-holes 55, so that the stability of the GND potential can be enhanced.

Furthermore, according to this embodiment, the GND loop breaking slits 70 are provided so that the GND pins 61 at both the sides of the IC 50 are star-wired with the bypass capacitor 57 as a starting point. According to this construction, the circuit impedances from, the bypass capacitor 57 to the respective GND pins 61 at both the sides of the IC 50 are substantially equal to one another, so that the potential difference among the GND pins 61 is suppressed.

The following modification may be made to this embodiment.

For example, in this embodiment, the GND loop breaking slit 70 is provided in the range of the main area 51A of the GND pattern 51. However, this embodiment is not limited to this style, and the GND loop breaking slit 70 may formed to extend to the bypass capacitor connection area 51C so that the end portion 71 thereof is located in the neighborhood of the bypass capacitor 57 as shown in FIG. 8(A). In this case, the GND loop breaking slit 70 is provided so as to split the GND pins 61 at both the sides of the IC 50 into two groups when viewed from the bypass capacitor 57. Therefore, the respective GND pins 61 at both the sides of the IC 50 are connected in a star-wired style with the bypass capacitor 57 as a starting point as shown in FIG. 8(B).

<Second Embodiment>

Figure 9:
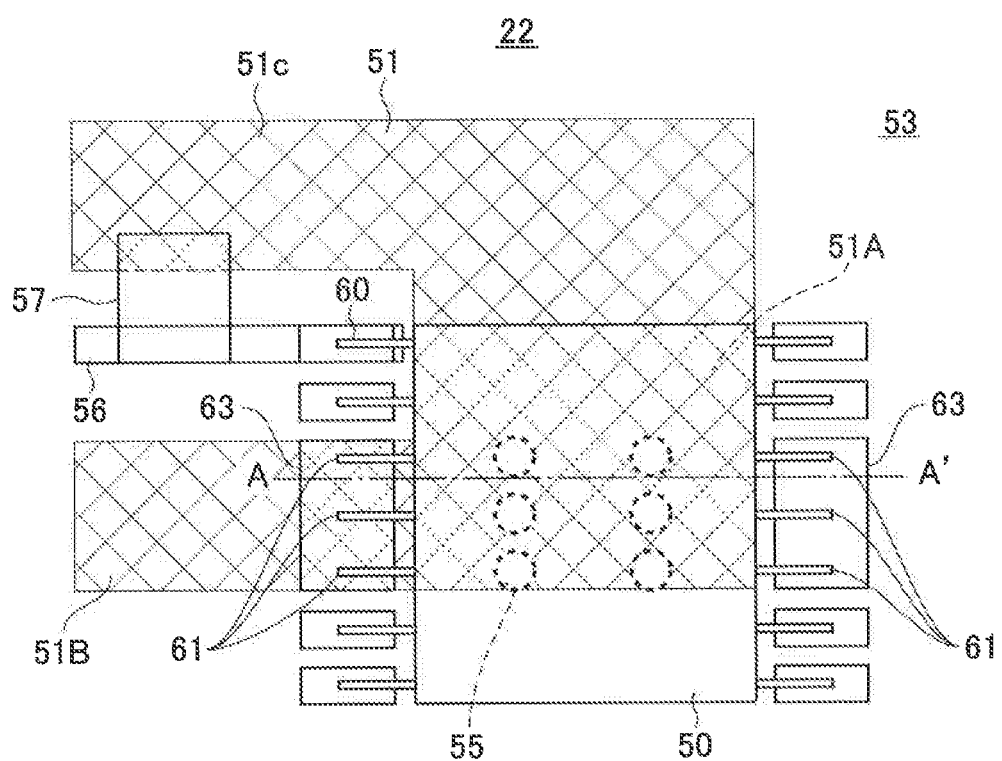
FIG. 9 is a diagram showing a mount, state of a control board according to a second embodiment of the present invention.
Figure 10:
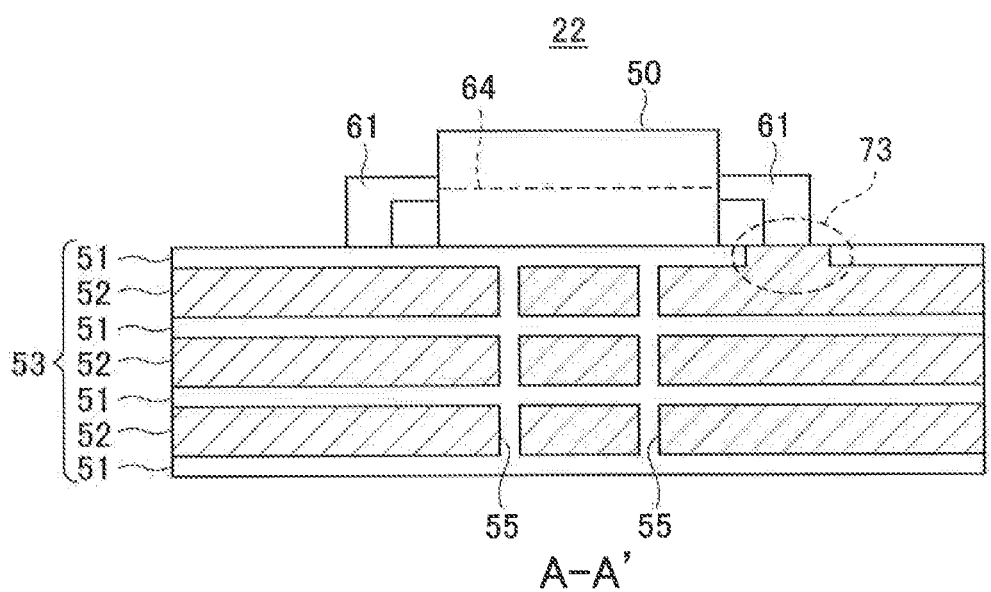
FIG. 10 is a cross-sectional view taken along an A-A' line of FIG. 9.

FIG. 9 is a diagram showing a mount state of a control board 22 according to an embodiment, and FIG. 10 is a cross-sectional view taken along an A-A' line of FIG. 9. In FIGS. 9 and 10, the members described with reference to the first embodiment are represented by the same reference numerals, and the description thereof is omitted.

In this embodiment, a GND loop connecting the GND line 64 of the IC 50, the GND pins 61 and the GND pattern 51 is prevented from being formed as follows.

That is, as shown in FIG. 9, in order to form the GND pattern 51 so that the GND pattern 51 avoids portions to which the GND pins 61 provided at one side of the IC 50 are connected, a connection pin area 513 is provided at only one side of the IC 50 in the GND pattern 51. According to this construction, as shown in FIG. 10, a GND pattern defective portion 73 at which the GND pattern 51 is defective is formed at one side of the IC 50 between the IC 50 and the GND pattern 51 so as to prohibit the connection between each GND pin 61 and the GND pattern 51.

This GND pattern, defective portion 73 breaks the GND loop through which the GND line 64 of the IC 50, the GND pins 61 and the GND pattern 51 are connected to one another. Therefore, as in the case of the first, embodiment, even when magnetic field occurs at the switching time, the variation of the GND potential can be suppressed, and the malfunction of the IC 50 and each circuit of the control board 22 can be prevented.

Furthermore, it is unnecessary to provide the GND loop breaking slit 70 on the main area 51A of the GND pattern 51 located just below the IC 50, and therefore it is expectable that the contact area between the IC 50 and the main area 51A can be prevented from decreasing and thus the radiation effect can be attained, <Third Embodiment>

Figure 11:
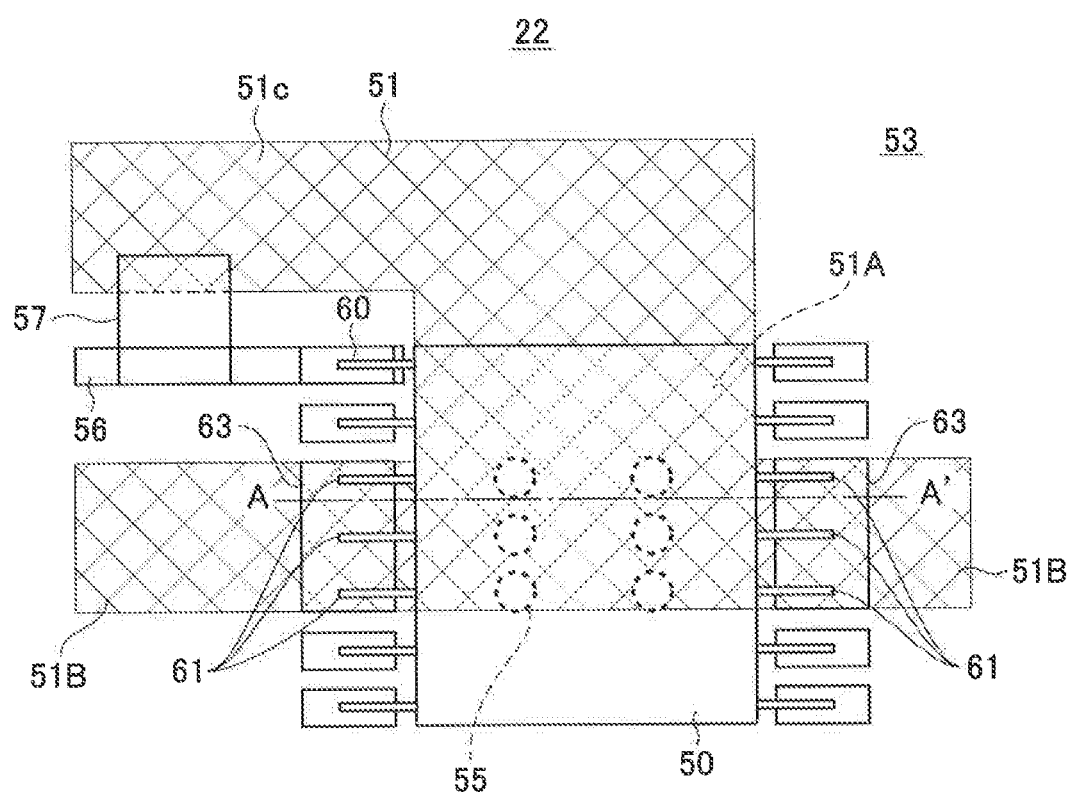
FIG. 11 is a diagram showing a mount state of a control board according to a third embodiment of the present invention.
Figure 12:
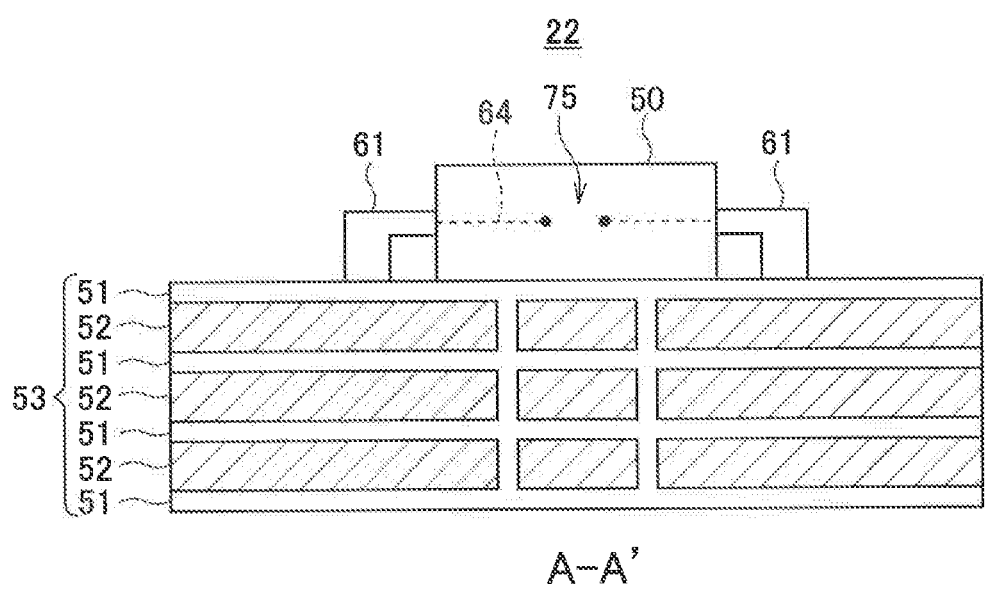
FIG. 12 is a cross-sectional view taken along an A-A' line of FIG. 11.

FIG. 11 is a diagram showing the mount state of a control board 22 according to this embodiment, and FIG. 12 is a cross-sectional view taken along an A-A' line of FIG. 11. In FIG. 11 and 12, the elements described with reference to the first embodiment are represented by the same reference numerals, and the description thereof is omitted.

In this embodiment, a GND loop through which the GND line 64 of the IC 50, the GND pins 61 and the GND pattern 51 are connected to one another is prevented from being formed as follows.

That is, in this embodiment, the GND loop breaking slit 70 is not provided to the GND pattern 51 as shown in FIG. 11, but the GND line 64 constructed by the internal circuit of the IC 50 is provided with an opening portion 75 for breaking the conduction between the GND pins 61 at both the sides of the IC 50 as shown, in FIG. 12. The opening portion 75 breaks the GND loop which connects the GND line 64 of the IC 50, the GND pins 61 and the GND pattern 51. Therefore, as in the case of the first and second embodiments, even when magnetic field occurs at the switching time, the variation of the GND potential can be suppressed, and the malfunction, of the IC 50 ana each of the control, board 22 can be prevented.

The opening portion 75 is configured by divide the internal circuit so that the GND pins 61 at both the sides of the IC 50 are not connected to each other through the internal circuit, and they are electrically independent of each other. According to this construction, as in the case of the second embodiment, it is unnecessary to provide the GND loop breaking slit 70 in the main area 51 of the GND pattern 51 just below the IC 50, so that a radiation effect is expectable without reducing the contact area between the IC 50 and the main area 51A. Furthermore; since it is unnecessary to modify the GND pattern. 51 of the control board 22, even when the control board 22 having any GND pattern 51 is mounted, the formation of the GND loop can be surely prevented.

Each of the above embodiments merely represents an aspect of the present invention, and any modification and application may be made to the embodiments without departing from the subject matter of the present invention.

DESCRIPTION OF REFERENCE NUMERALS 10 power module (semiconductor device)
19 case body (housing)
20 semiconductor module
22 control board
24 power switching element
30 three-phase inverter circuit
31 insulating board
40 DC input terminal
41 AC output terminal
51 GND pattern
51A main area
51B connection pin area
51C bypass capacitor connection area
53 multilayered board
55 through-hole
57 bypass capacitor
61 GND pin
64 GND line
70 GND loop breaking slit (breaking portion)
73 GND pattern defective portion
75 opening portion
Z1, Z2, Z2' circuit impedance

The invention claimed is:

1. A semiconductor device including:
an insulating board having a power switching element; and
a control board having IC for controlling the power switching element, wherein the insulating board and the control board are mounted at upper and lower sides in a housing so as to be overlapped with each other in a vertical direction, GND pins are provided at both the sides of the IC, and the control board is provided with a GND pattern to which the GND pins of the IC are connected, and a breaking portion for breaking a GND loop formed by electrical connection of the IC, the GND pins at both the sides of the IC and the GND pattern is provided.

2. The semiconductor device according to claim 1, wherein the breaking portion comprises a GND loop breaking slit that is provided in an area of the GND pattern covered by the IC so that the GND loop breaking slit traverses an area between the GND pins at both the sides of the IC.

3. The semiconductor device according to claim 2, wherein a plurality of GND pins are arranged at each of both the sides of the IC in a range of a predetermined length so that the GND pins at both the sides of the IC confront one another through the IC, and a slit length of the GND loop breaking slit is set to be equal to the predetermined length at which the GND pins are arranged.

4. The semiconductor device according to claim 2, wherein the control board comprises a multilayered board in which circuits of respective layers are connected to one another through a through-hole, and the through-hole is provided at an edge portion of the GND loop breaking slit.

5. The semiconductor device according to claim 2, wherein the control board is provided with a power supply pattern and a bypass capacitor through which the power supply pattern and the GND pattern are connected to each other, and the GND loop breaking slit is provided so that the GND pins at both the sides of the IC are arranged in a star-wired connection style with the bypass capacitor as a starting point.

6. The semiconductor device according to claim 1, wherein the GND pattern is formed so as to avoid a place to which the GND pins provided at one side of the IC are connected, thereby constructing the breaking portion.

7. The semiconductor device according to claim 1, wherein an opening portion for electrically breaking the GND pins at both the sides of the IC is provided in the IC, thereby constructing the breaking portion.

* * * * *